United States Patent [19]

Grabbe

[11] 4,142,287
[45] Mar. 6, 1979

[54] ELECTRICAL DEVICES SUCH AS WATCHES AND METHOD OF CONSTRUCTION THEREOF

[75] Inventor: Dimitry G. Grabbe, Lisbon Falls, Me.

[73] Assignee: AMP Incorporated, Harrisburg, Pa.

[21] Appl. No.: 754,817

[22] Filed: Dec. 27, 1976

[51] Int. Cl.² .............................................. H05K 7/14
[52] U.S. Cl. ...................................... 29/628; 29/177;
58/23 R; 58/88 R; 174/52 FP
[58] Field of Search ................. 58/50 R, 23 R, 55, 88;
174/52 FP; 29/177, 179, 628

[56] References Cited

U.S. PATENT DOCUMENTS

| | | | |
|---|---|---|---|
| 3,759,031 | 9/1973 | McCullogh | 58/50 R |
| 3,846,734 | 11/1974 | Pauza | 174/52 FP |
| 3,904,262 | 9/1975 | Cutchaw | 174/52 FP |
| 3,912,984 | 10/1975 | Lockhart | 174/52 FP |
| 3,945,196 | 3/1976 | Wood | 58/50 R |
| 3,977,176 | 8/1976 | Murakami | 58/23 BA |
| 3,986,334 | 10/1976 | Harper | 58/23 R |
| 3,986,335 | 10/1976 | Harper | 58/50 R |
| 4,033,110 | 7/1977 | Sagarino | 58/50 R |

Primary Examiner—Robert K. Schaefer
Assistant Examiner—Leonard W. Pojunas, Jr.
Attorney, Agent, or Firm—Frederick W. Raring

[57] ABSTRACT

A method of making electrical devices, and the electrical devices made thereby, comprising the steps of: stamping from a sheet of metal a pattern of conductors configured to connect circuit components together in a relationship which forms a useful product, such as a watch, with the terminals of each of said circuit components being adjacent and connectable to appropriate terminating means formed in said pattern of conductors when said circuit components have predetermined positions adjacent said pattern of conductors; encapsulating said pattern of conductors with plastic having cavities and apertures formed therein, the cavities each having a configuration and a location to receive one of said circuit components therein in said predetermined positions and with said terminating means extending into said cavities to terminate the terminals of said circuit components; forming at least some of said component terminals on the surface of said components in positions to bend over the terminating means when the component is inserted in a cavity to thereby make an electrical connection between the component terminals and the terminating means, and to provide a retaining housing for the components in said cavity. In some instances, the component terminals are wire-like in shape and require the forming of the terminating means in a configuration which can be crimped therearound or, alternatively, require the forming of the terminating means into a plate with a slot therein and into which slot the wire-like terminal can be inserted. Some of the apertures in the plastic encapsulation are positioned to enable the severing of portions of the lead frame conductors which support the lead frame until it is encapsulated and others of the apertures are positioned to enable the severing of various combinations of selected conductors to produce different patterns of interconnections between the circuit components and thereby to produce various electrical devices each capable of performing different functions.

6 Claims, 25 Drawing Figures

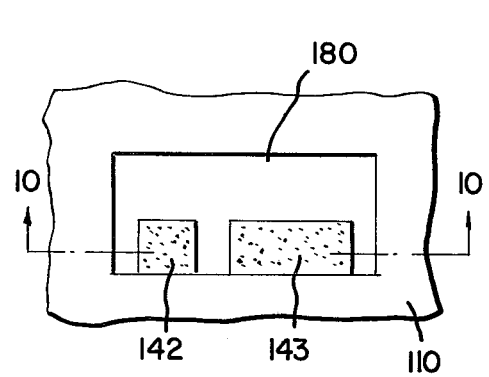
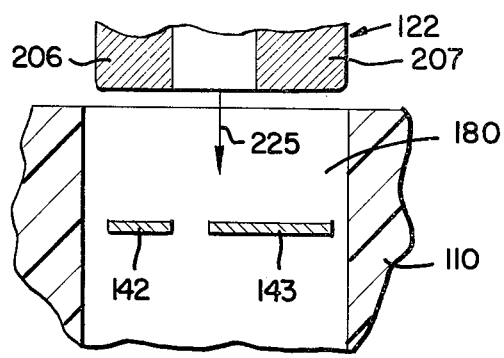
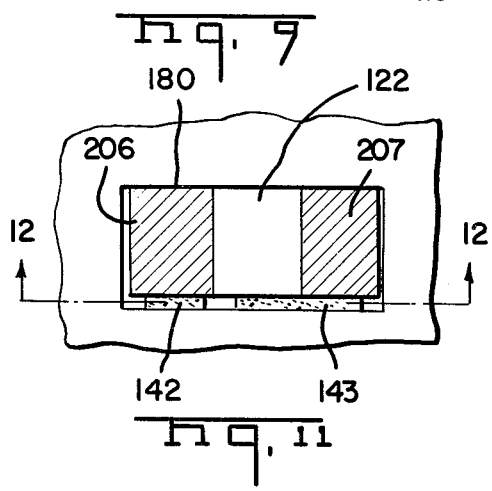
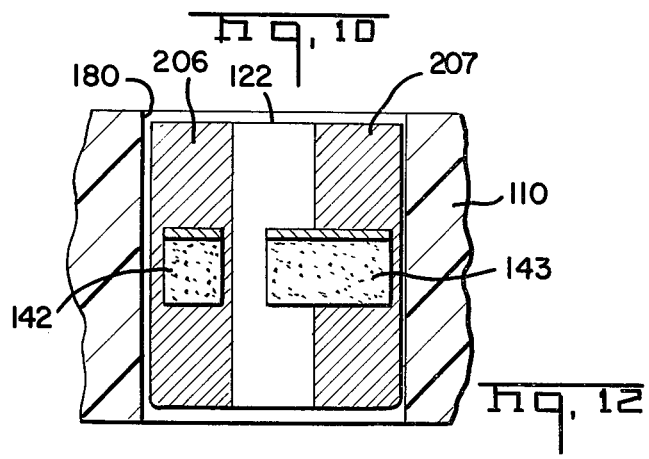
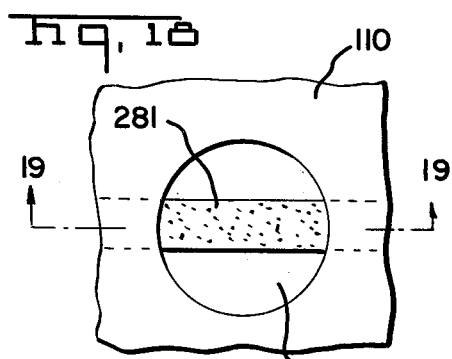
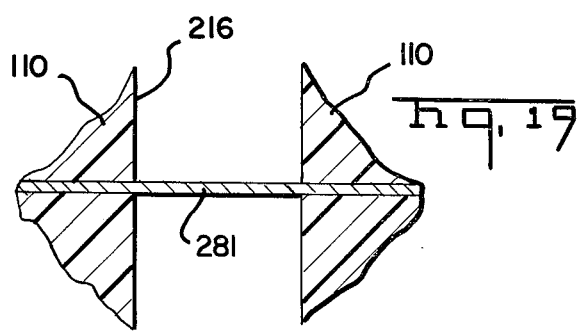
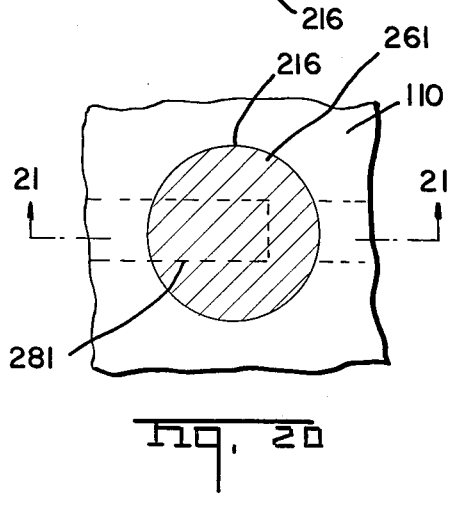
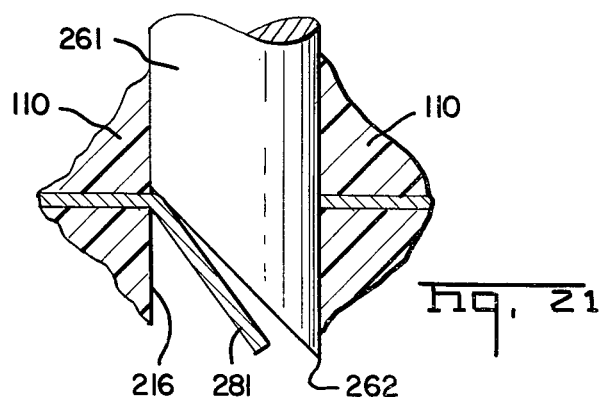

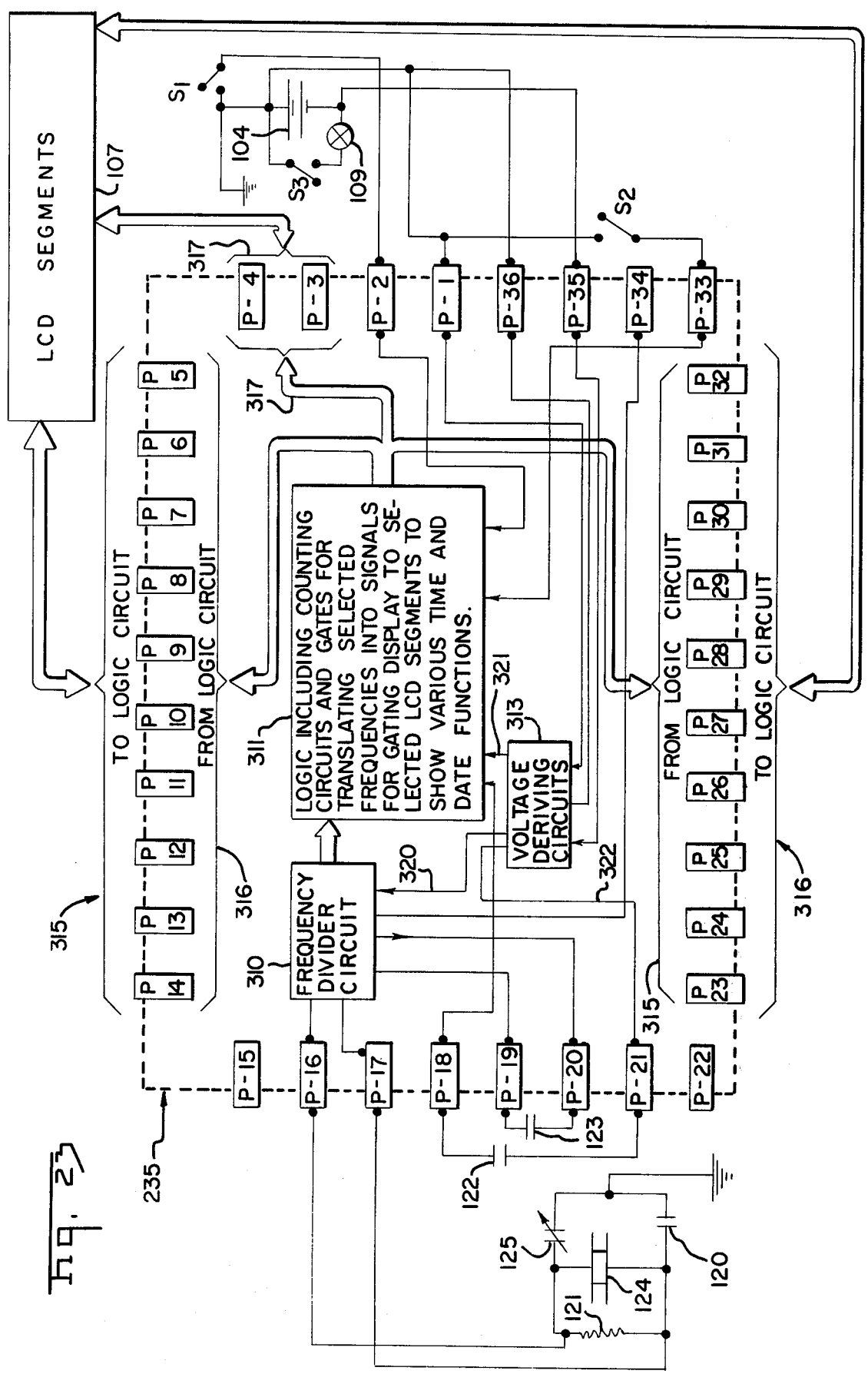

ELECTRICAL DEVICES SUCH AS WATCHES AND METHOD OF CONSTRUCTION THEREOF

BACKGROUND OF THE INVENTION

This invention relates to a novel method of constructing electrical devices and the electrical devices constructed thereby and more particularly the invention relates to a method of constructing electrical devices wherein the circuit and other components thereof are connected together by circuit paths stamped from a sheet of metal and encapsulated in plastic, with the stamped conductive paths and the plastic together forming terminals and housing receptacles for the various components employed in the electrical device.

The development of the structural characteristics of electrical devices and the method of making them has progressed from the stage wherein relatively large individual components were mounted on metal chassies and interconnected by discrete wire conductors soldered to terminals to modern day techniques wherein large scale integrated (LSI) circuit chips, each containing thousands of semiconductor devices, are formed on a tiny substrate, measuring perhaps a half an inch on a side. Intermediate stages in the development of electronic manufacturing techniques has included printed circuit boards with discrete components, such as transistors, resistors, capacitors and inductors mounted thereon. More recently, with the development of the LSI chip, techniques have been developed for mounting such LSI chip upon printed circuit boards or other substrates by means of spider assemblies and/or lead frame structures which are now well known in the art. Components external to the LSI chip, which can include discrete components such as oscillators, capacitors, inductors, resistors or display devices, for example, are frequently mounted directly upon the printed circuit board by solder or retained in sockets or connectors which in turn are mounted upon the circuit board. The interconnections between the various circuit components and the terminals on the edge of the LSI chip are conductive paths formed by well known means upon the surface of the printed circuit board. In some instances the circuit board is multi-layered with two or more layers of conductive circuit paths interconnected by plated-through holes at selected points in the assembly. One currently prevelant form of mounting an LSI chip upon a printed circuit board is a packaging technique known as a dual-in-line package (DIP) which consists primarily of a plastic housing containing the LSI chip and having two rows of terminals connected at one end to the LSI terminals, usually by means of a spider assembly, and having the other ends extending from the sides of the plastic housing and inserted directly into apertures formed in a printed circuit board or into a socket which in turn is mounted upon a printed circuit board.

By its very nature a printed circuit board involves the soldering of discrete components thereon and, in many cases, the use of special connectors or sockets by which components are secured thereon. Such sockets or connectors can be in the form of female receptacles individually inserted in holes in the printed circuit board and which receive the terminals of a component, or can be sockets which are soldered directly to the surface of the circuit board or have terminals which fit within apertures in the circuit board with circuit component mounted upon female terminals formed in the socket.

The cost of an assembly including a printed circuit board with the various connectors needed to connect and retain components thereupon can be quite high, not only in the fabrication of the printed circuit board but also in the fabrication of the connectors and the mounting of the components either directly upon the board or upon the connectors.

BRIEF STATEMENT OF THE INVENTION

In accordance with one preferred form of the invention a pattern of conductive paths is stamped from a flat piece of metal to form a resulting pattern of conductive paths known in the art as a lead frame. Such lead frames can be stamped iteratively in strip form and stored upon a reel. By appropriate plastic encapsulating apparatus, such as shown in Canadian Pat. No. 932,917 issued Sept. 4, 1973, to John H. Lauterback and entitled "Injection Molding Machine", each of the iterative lead frame structures is encapsulated in plastic but with cavities and apertures of various shapes and sizes formed on both sides of the plastic encapsulation. Some of the cavities and apertures are designed to receive components and some to receive shearing pins which sever certain paths in the lead frame to produce a desired pattern of conductive paths therein.

The plastic encapsulation is formed so that the ends of selected lead frame conductors extend into the various component receiving cavities to provide terminating means for circuit components to be inserted later into said cavities. The type components which can be inserted into such cavities are numerous and include, for example, resistors, capacitors, inductors, lamps, crystals, LCD or LED displays, batteries, LSI chips, switch actuation means such as buttons or levers and other components.

For the purpose of illustrating the invention the construction of a watch will be employed. It will be apparent, however, that the principles of the invention are applicable to many devices other than watches. The components required for a watch include an LSI chip, an LCD or LED display, a battery, a crystal oscillator, four or five capacitors, a lamp, a resistor, and two to four switches, depending upon the number of functions desired in the watch.

In the manufacture of the watch the lead frames are stamped in an iterative manner from a continuous strip of metal in a predetermined configuration to effect certain interconnections between the various components making up the watch, when such components are inserted in the cavities in the encapsulating plastic, as will be described later.

Each of the lead frames in the iterative strip of lead frames is then encapsulated in plastic with cavities (and apertures) provided at predetermined positions in accordance with the configuration of the lead frame structure so that insertion of the components into said cavities will result in the interconnection of such components with each other in a predetermined manner necessary to perform the desired operational functions of the watch.

Each of the various cavities in the plastic encapsulation is of a dimension and a size to provide the housing needed to receive and retain the particular component inserted therein, as well as to enable the ends of lead frame conductors to extend into said cavities in the proper position to terminate the terminals of the circuit component.

In accordance with one feature of the invention certain of the components have their terminals formed on the surface thereof. For example, capacitors and resistors are formed in the shape of rectangular or cylindrical solids with the terminals comprising metal platings on the surfaces thereof. Cavities in the plastic are configured to have substantially the same shape as the component which they are to receive, but slightly larger, and with the ends of predetermined conductors of the lead frame extending therein. As the capacitor or resistor is inserted into its cavity the similarity in size and configuration of the cavity and the component causes the ends of the lead frame conductors to be bent over by virtue of the component being forced therein so that the bent over ends of the lead frame conductors frictionally engage the terminals on the surface of the component. The spring effect between the bent-over terminating means and the component terminals against which it is bearing function to physically retain the component within the cavity as well as to make a lasting electrical contact therewith.

In accordance with another feature of the invention some of the components can have external wire-like terminals. Such components also fit into cavities into which extend the ends of certain ones of the lead frame conductors, which can be crimped or bent around the ends of said wire-like terminals, thus making a solderless connection. If desired, a solder connection can be made, but it would ordinarily be an unnecessary operation inasmuch as the solderless crimping forms effective and permanent electrical and mechanical connections.

In accordance with yet another feature of the invention the large scale integrated (LSI) circuit chip is mounted upon first ends of the conductors of a spider assembly and the other ends of the spider assembly conductors then mounted upon the ends of a plurality of lead frame conductors which extend to and terminate around the perimeter of an opening sized to receive the spider assembly. The securing of the ends of the spider assembly conductors to the ends of the lead frame conductors can be accomplished effectively by thermal compression bonding, as will be described in more detail later herein.

In accordance with still another feature of the invention certain of the conductors of the lead frame are configured to form switches, usually normally open. The closure or opening of these switches functions to complete circuits and activate logic in the LSI chip to perform predetermined functions within the watch, such as showing the hours and minutes, the seconds, the date, or other functions in accordance with the particular design of the watch.

Another feature of the invention is the inclusion of holes in the plastic encapsulation which lead to various conductive paths of the lead frame structure. Some of these conductive paths are simply supporting structure required to hold the lead frame together after it has been stamped and before it is encapsulated and must be severed by appropriate tooling means through the apertures in the plastic in order to make the circuit operable.

It is further possible to configure the lead frame structure in such a manner that it can perform combinations of N number of functions, whether the structure be a watch or a calculator or any one of many other electronic devices. The holes in the plastic encapsulation are positioned to enable severance of the lead frame at certain predetermined points therein in order to form the pattern of the lead frame to connect the circuit components together in a manner to perform the desired combination of functions. In other words, with the proper lead frame configuration the holes in the plastic encapsulation can be positioned so that the lead frame structure can be formed into a plurality of different component interconnecting circuits which, together with the components retained in the plastic encapsulation, result in either different devices or devices capable of performing different groupings of functions.

In accordance with still another feature of the invention two or more lead frames can be stacked one upon the other and encapsulated within one or more separate encapsulations with such encapsulation surrounding portions of one or more of the lead frames. The encapsulations can contain cavities with the ends of conductors of the lead frames extending into said cavities for the reception and retention of circuit components in the manner described above. Connections between the conductors of stacked lead frames can be accomplished by holes formed in the encapsulation and by means of conductive pins or pegs forced into said holes and which engage the ends of conductors of two or more of the stacked lead frames.

BRIEF DESCRIPTION OF THE DRAWINGS

The above-mentioned and other objects and features of the invention will be more fully understood from the following detailed description thereof when read in conjunction with the drawings in which:

FIGS. 9 through 12 show one means for terminating a component by means of the ends of lead frame conductors which extend into a cavity in the encapsulating plastic and in which said termination is made simply by inserting said component into said cavity with the component terminals coming into contact with, and bending over, the ends of the lead frame conductors, and thereby making frictional contact with said ends of the lead frame conductors;

FIGS. 18 through 21 show the means by which a supporting element of the lead frame can be severed after being encapsulated in plastic by means of a hole formed into the plastic and into which a cutting punch is inserted;

FIG. 23 shows a schematic diagram of the circuit of the watch of the present invention, the general logic of the LSI chip and the connections therebetween;

DETAILED DESCRIPTION OF THE INVENTION

This specification is organized in the manner set forth in the following outline:
 I. OVERALL ASSEMBLY (FIGS. 1-5)
 II. RELATIVE POSITIONING OF COMPONENTS IN ASSEMBLY (FIGS. 6-8)
 III. VARIOUS MEANS FOR ATTACHING COMPONENT TERMINALS TO LEAD FRAME AND USE OF APERTURES FOR SEVERING TEMPORARY SUPPORTING MEMBERS IN LEAD FRAME (FIGS. 9-22)
 IV. SCHEMATIC CIRCUIT DIAGRAM OF WATCH STRUCTURE (FIG. 23)
 V. USE OF APERTURES IN PLASTIC ENCAPSULATION TO ALTER LEAD FRAME CIRCUIT AFTER ENCAPSULATION IN PLASTIC (FIG. 24)
 VI. OTHER GENERAL FORMS AND APPLICATIONS OF INVENTION (FIG. 25)

I. OVERALL ASSEMBLY (FIGS. 1-5)

Figure 1:
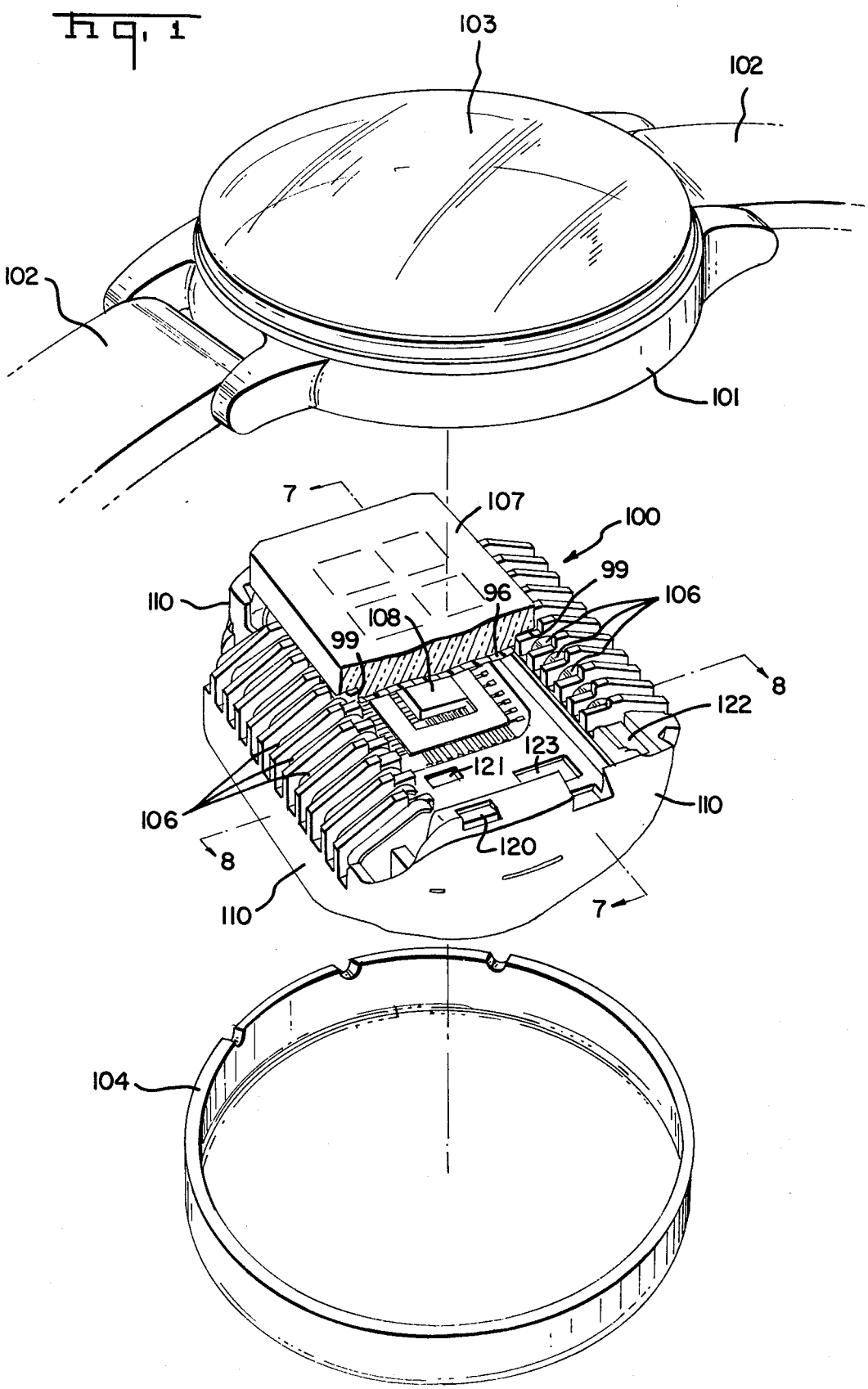
FIG. 1 is an exploded, perspective view of a watch showing two sections of the case, portions of the strap and the functional portion thereof.

Referring now to FIG. 1 the two sections of the case 101 and 104 are shown exploded away from the operative portion 100 of the watch. The upper case section 101 has a lens 103 through which can be viewed the display panel 107. Display panel 107 can be a liquid crystal device (LCD) illuminated by lamp means 109 and light diffusion plate 96 (see FIG. 2) upon the activation of a switch (switch $S_3$ of FIG. 6) having an actuating button (not shown) extending externally of the case.

The afore-mentioned switch $S_3$ and many other elements of the operating portion 101 are not shown in FIG. 1 but are shown in detail in other figures, such as FIGS. 2 through 8. The operative portion 100 is shown in its completed state in FIG. 1 with a portion of the LCD display 107 broken away to expose a few of the elements contained within the watch, as for example, the large scale integrated circuit chip 108, the components 120, 121, 122 and 123 and light diffusion plate 96. Also shown in FIG. 1 is the general arrangement of the lead frame conductors 106 which are bent around the encapsulating plastic portion 110 to form a pattern of terminals upon which the LCD display 107 is mounted. It can further be seen in FIG. 1 that the terminals 99 of the LCD display 107 make contact with the ends of the lead frame conductors 106.

Figure 2:
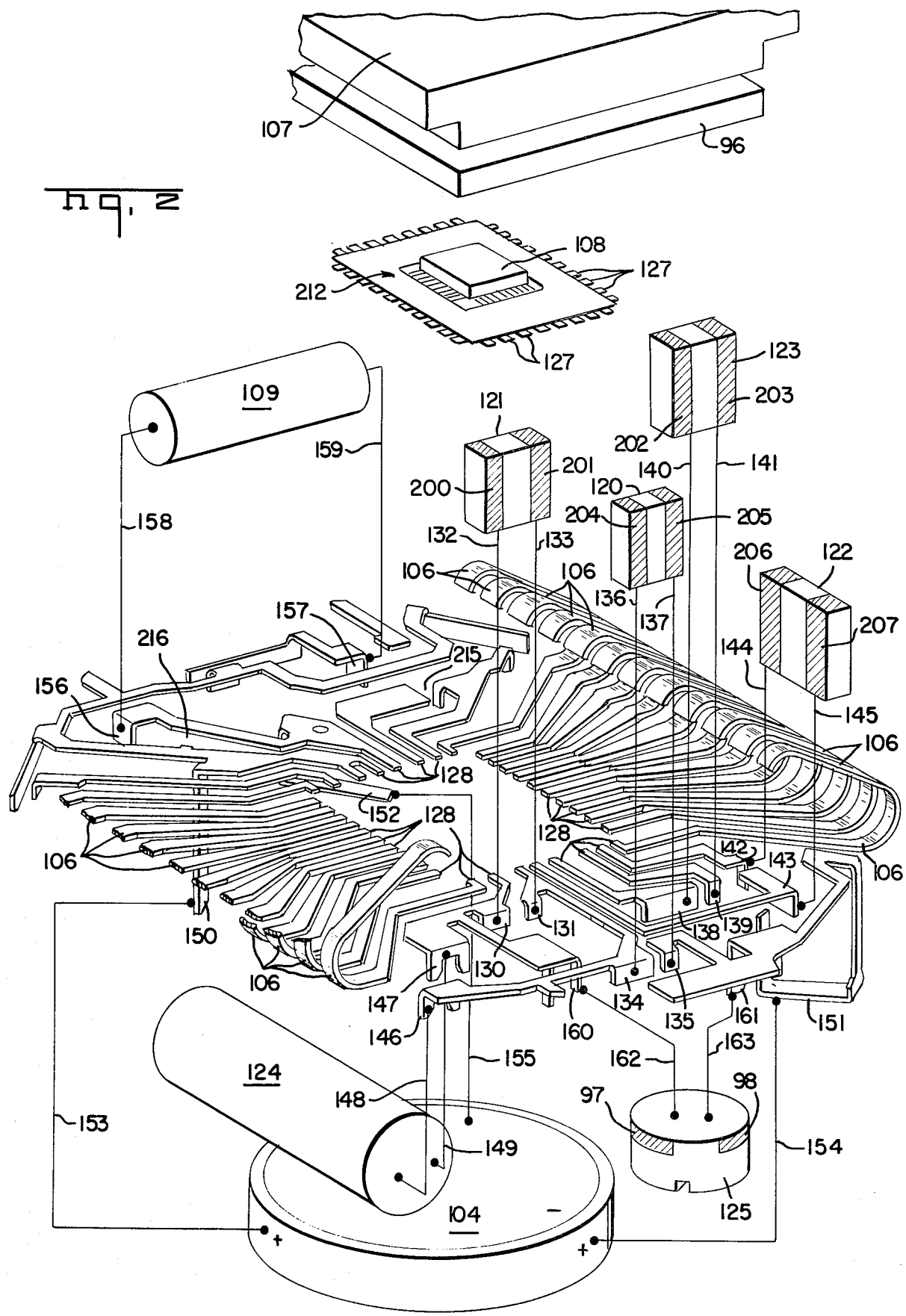
FIG. 2 is an exploded, perspective view of the lead frame structure with all of the conductors bent into their ultimate position, but without the plastic encapsulation, and with the various components shown in exploded fashion away from said lead frame structure, but with their positions in the lead frame indicated.

In FIG. 2 there is shown an exploded view of the operative portion 100 of the watch but without the plastic encapsulation. More specifically, FIG. 2 shows the lead frame bent into its final configuration, with the plastic removed, and with the various components exploded away from the lead frame with lines indicating the points in the lead frame to which their terminals are connected. The plastic encapsulation is not shown in FIG. 2 in order to provide the reader with a better understanding of the relationship between the lead frame and the components of the watch and the fact that the lead frame comprises the entire pattern of interconnections between the terminals of the various components of the watch, including the terminals of the LSI chip 108 and the terminals of LCD display 107.

Figure 5:
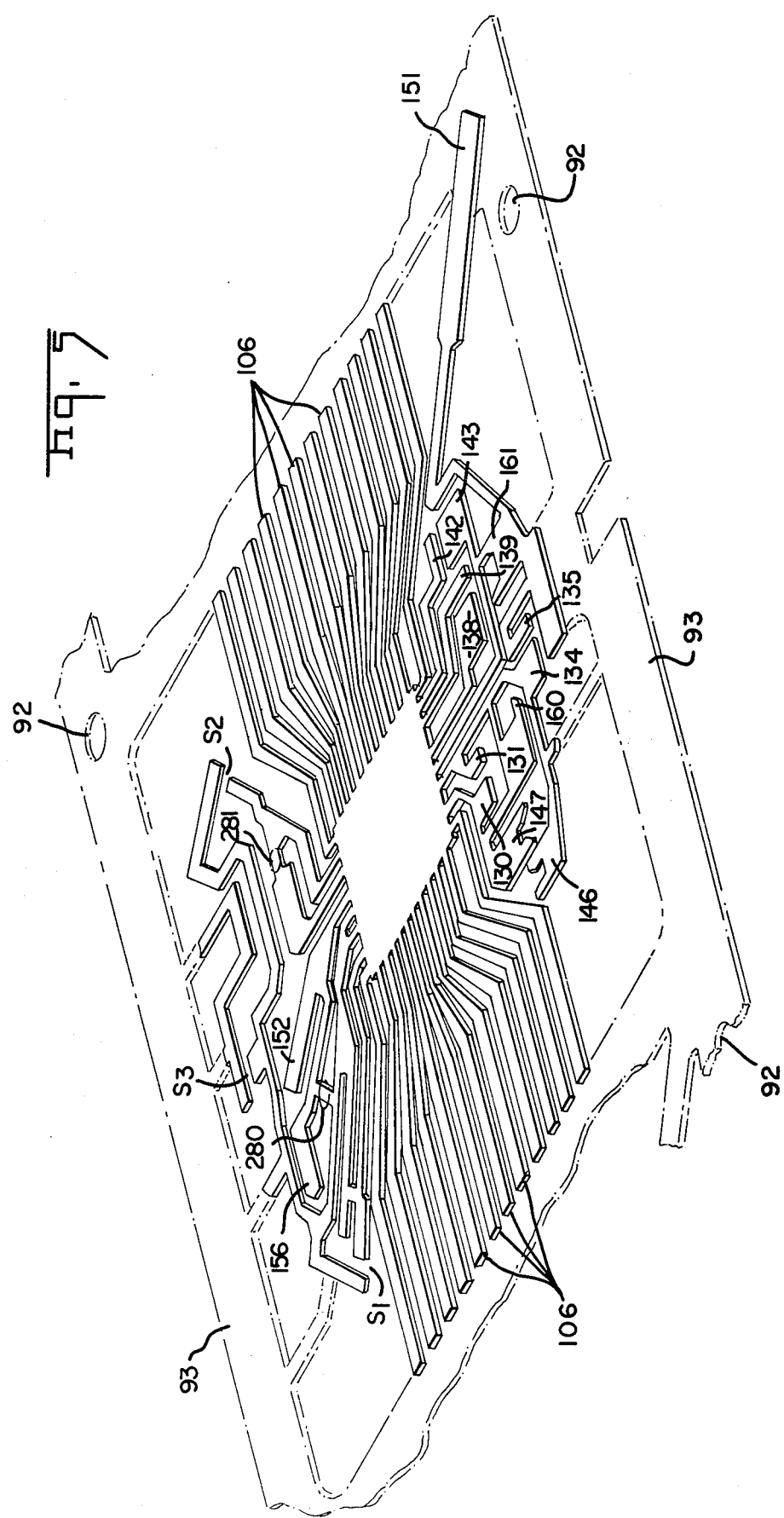
FIG. 5 is a perspective view of the lead frame structure before encapsulation in plastic and before bending of any of the lead frame conductors.

In its original, stamped configuration, before encapsulation in plastic and before any bending of the individual lead frame conductors, the lead frame is as shown in FIG. 5. The various terminals to which the components of FIG. 2, including capacitors 120, 122, 123 and 125, resistor 121, crystal package 124, lamp 109 and battery 104, are connected, are identified by the same reference characters in FIG. 5 as they are in FIG. 2. The carrier 93 is also shown in FIG. 5 and is understood to carry other lead frames similar to the one shown in FIG. 5. Apertures 92 are formed in the carrier at periodic intervals to aid in the manufacture of the lead frame structure as well as in the plastic encapsulation thereof and the insertion of the components in the plastic encapsulation.

As stated above, the various circuit components including capacitors 120, 122, 123, resistor 121, crystal 124 and lamp 109 are shown exploded away from their position in the lead frame structure in FIG. 2. Further, in the cases of many of the components, such as for example, capacitors 120, 122, 123, and 125 and resistor 121, the actual contact between the terminals of such components and the lead frame conductors is made when the component is inserted into a cavity formed in the plastic encapsulation, as shown in more detail in FIG. 3, and in the process of being so inserted, bends over the ends of the lead frame conductors which extend into said cavities, which are positioned to mate with the component terminals.

Figure 3:
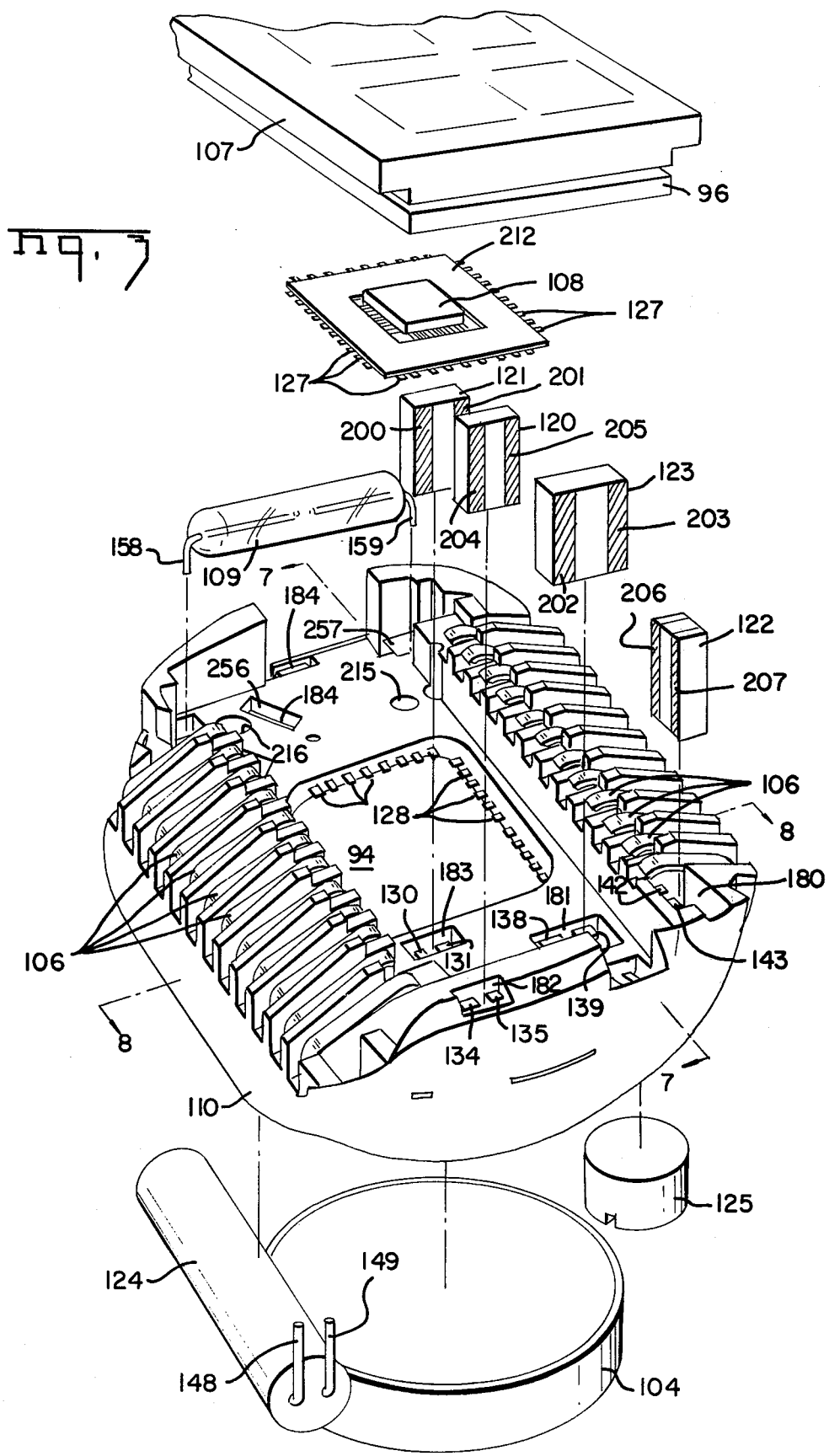
FIG. 3 is an exploded, perspective view of one side of the encapsulated lead frame assembly with the lead frame conductors shaped in their final configuration, and further with various components which fit into said one side of the assembly exploded away therefrom but with their positions in said assembly indicated.

Consider capacitor 122 as a specific example. Capacitor 122 has formed on the surface thereof terminals 206 and 207, as shown in FIGS. 2 and 3, and fits into the cavity 180 of FIG. 3. The ends 142 and 143 of conductors of the lead frame structure extend into cavity 180 in the plane of the metal in which they were originally stamped. However, as the capacitor 122 is pushed into cavity 180, the ends 142 and 143 of the lead frame structure are bent over by capacitor 122 in the manner shown and to be discussed later herein in detail re FIGS. 9 through 12, to not only make electrical contact between ends 142 and 143 but also to frictionally retain the component 122 within cavity 180. It is to be noted that the terminals 206 and 207 formed on the surface of the rectangularly-shaped capacitor 122 will mate respectively with the ends 142 and 143 of the lead frame structure as the capacitor 122 is inserted into cavity 180 of FIG. 3.

In a similar manner capacitors 120 and 123 and resistor 121 have a pair of electrodes formed on the surface thereof which can be in the form of plated metal. Specifically, capacitor 120 has terminals 204 and 205 formed thereon; capacitor 123 has terminals 202 and 203 formed thereon; and resistor 121 has terminals 200 and 201 formed thereon. The terminals 204 and 205 of capacitor 120 will bend over and mate with the ends 134 and 135 of the lead frame structure when capacitor 120 is inserted into cavity 182 of FIG. 3. The terminals 202 and 203 of capacitor 123 will bend over and mate with the ends 138 and 139 of the lead frame structure when capacitor 123 is inserted into cavity 181 of FIG. 3.

The terminals 200 and 201 of resistor 121 will bend over and mate with the ends 130 and 131 of the lead frame structure when resistor 121 is inserted into cavity 183.

Figure 4:
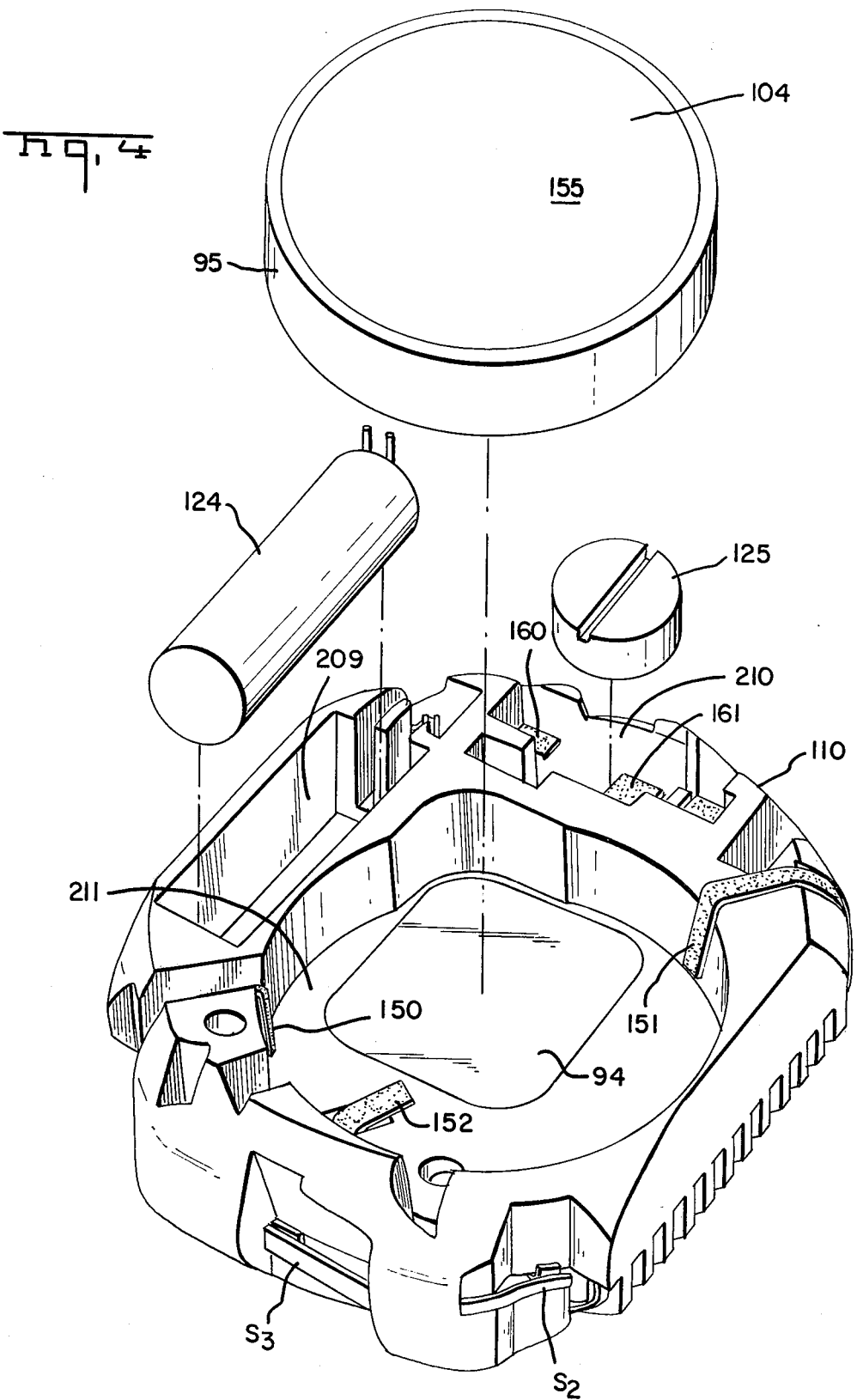
FIG. 4 is an exploded, perspective view of the reverse side of the encapsulated lead frame assembly with the lead frame conductors formed in their final positions and showing the battery component, the crystal oscillator, and the variable capacitor in exploded positions away from the plastic encapsulated lead frame assembly.

The variable capacitor 125 has contacts 97 and 98 formed on the surface thereof which mate with the ends 160 and 161 of the lead frame conductors, as shown in FIG. 2, and fit into the cavity 210 formed in the plastic encapsulation, as shown in FIG. 4. Battery 104 fits into cavity 211, as shown in FIG. 4. The positive contact of the cylindrically-shaped battery 104 comprises the outer perimeter 95 thereof, whereas the negative terminal 155 is formed on one of the major surfaces thereof, also shown in FIG. 4. Battery 104 is force fitted into cavity 210 and mates with the terminals 150, 151 and 152 such that positive terminal 95 thereof mates with two ends 150 and 151 of the lead frame structure, as shown in FIG. 2, whereas the negative terminal 155 mates with the end 152 of the lead frame structure.

In FIGS. 2 and 3 the LSI circuit chip 108 is mounted upon spider assembly 212 having individual terminals 127 that mate with those individual terminals 128 of the lead frame which extend into the open area or cavity 94 defined in the center of the encapsulated lead frame assembly. The ends 128 of the lead frame are connected to the end terminals 127 of the spider assembly 212 by suitable means, such as thermocompression bonding.

The mounting of the large scale integrated circuits upon the spider assembly 127 and the mounting of the spider assembly 212 upon the end terminals 128 of the lead frame structure are described in the following publication which is incorporated herein by reference: "Special Report: Film Carriers Star In High Volume IC Production" appearing on page 61 of the December 25, 1975, edition of Electronics, published by McGraw Hill.

The chip carrier 108 containing the LSI circuit chip can be formed in a number of ways, some of which are described in co-pending U.S. application Ser. No. 710,043 filed July 30, 1976, by Dimitry G. Grabbe and entitled "Circuit Chips Upon Lead Frames", assigned to the same assignee as the present invention and incorporated by reference herein.

II. RELATIVE POSITIONING OF COMPONENTS IN ASSEMBLY (FIGS. 6-8)

Figure 6:
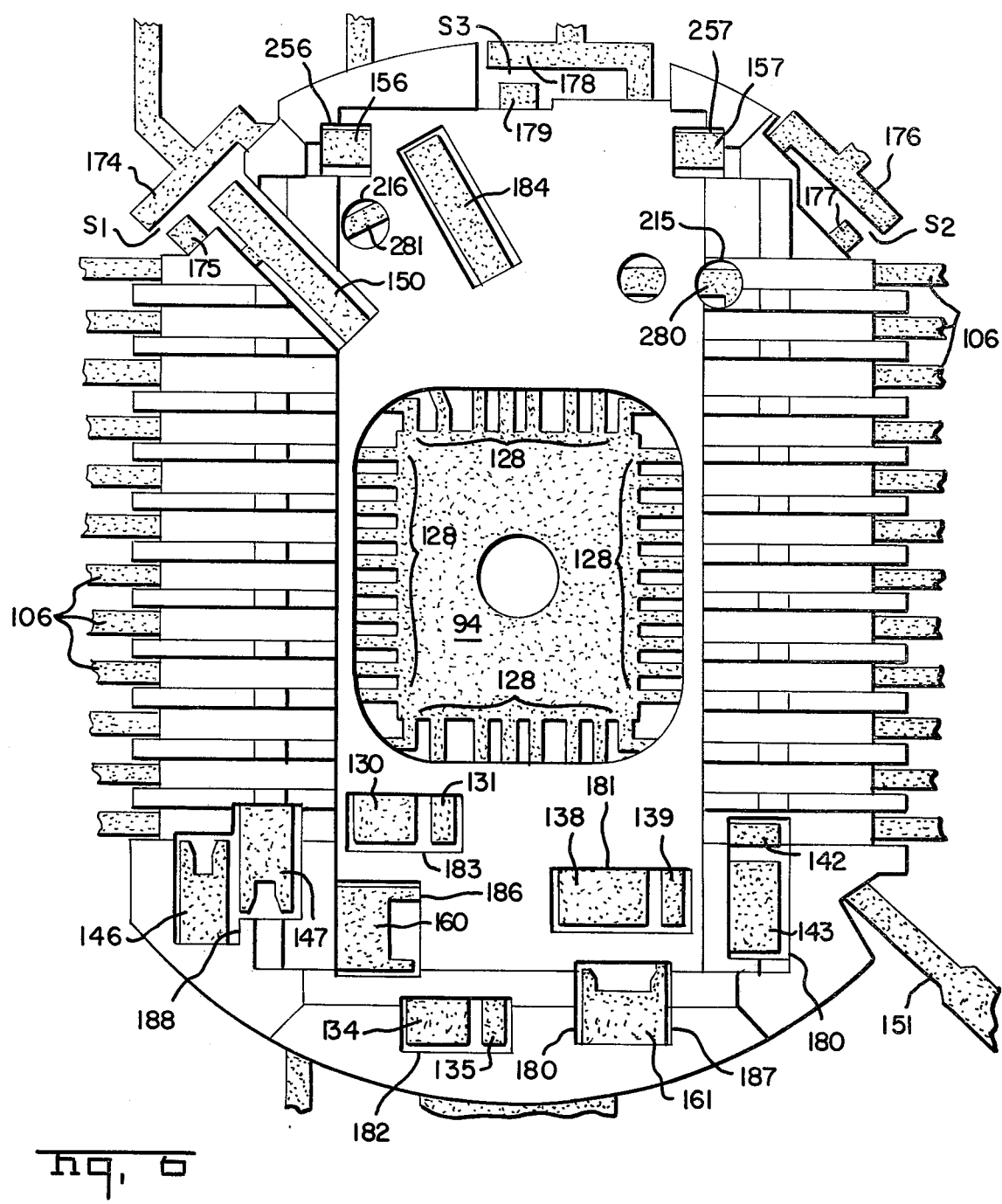
FIG. 6 is a top plan view of the encapsulated lead frame showing the various cavities and apertures therein but before the lead frame conductors have been bent into their final configurations.

FIG. 6 is a top view of the assembly showing the relative positions of some of the cavities which retain some of the circuit components of the device. More particularly the cavities shown in FIG. 6 are listed below in the left hand column and the components which fit therein are listed in the right hand column:

| CAVITY OR APERTURE | COMPONENT |
| --- | --- |
| 180 | Capacitor 122 |
| 181 | Capacitor 123 |
| 182 | Capacitor 120 |
| 183 | Resistor 121 |
| 184 | |
| 186 | Terminals for variable |
| 187 | capacitor 125 |
| 256 | |
| 257 | Terminals for lamp 109 |
| 215 | Supporting lead frame support- |
| 216 | ing elements 280 and 281 |

The lead frame ends which extend into each of the cavities are also shown and identified in FIG. 6. for example, in cavity 180, the lead frame ends 142 and 143 which extend therein are shown. The extensions of the lead frame ends 142 and 143 into the cavity 180 are also shown in FIG. 3.

In a similar manner the lead frame ends which extend into the other cavities are also shown in FIG. 6. Specifically, lead frame ends 138 and 139, connected to capacitor 123 are shown extending into cavity 181; lead frame ends 134 and 135 connected to capacitor 120, are shown extending into cavity 182; lead frame ends 130 and 131, connected to resistor 121, are shown extending into cavity 183; lead frame end 160, which is connected to variable capacitor 125, is shown extending into cavity 186 which opens onto cavity 210 on the other side of the plastic encapsulation as shown in FIG. 4; lead frame end 161 also connected to variable capacitor 125 is shown extending into cavity 187 which also opens onto cavity 210 on the other side of the plastic encapsulation, as shown in FIG. 4; lead frame conductors 156 and 157, which connect to lamp 109, are shown extending across cavities 256 and 257, which open onto large cavity 184 and enable crimping of the conductors 156 and 157 upon the wire-like terminals of lamp 109; lead frame ends 146 and 147, connected to oscillator 124, are shown extending into cavity 188; and lead frame supporting elements 280 and 281 are shown extending across cavities 216 and 215.

The ends 128 of the lead frame terminals which extend into the large centrally located cavity 94, and onto which the terminals of the spider assembly are secured, are also shown but without the spider assembly attached thereto. Also shown are the conductors 106 of the lead frame, but before their final bended-over configuration, in which they form the structural support and the electrical connections to the LCD assembly 107, as shown in FIG. 2.

Further, FIG. 6 shows the two terminals of each of the switches $S_1$, $S_2$ and $S_3$. The terminals of switch $S_1$ comprise lead frame ends 174 and 175; the terminals of switch $S_2$ comprise lead frame ends 176 and 177 and the terminals of switch $S_3$ comprise lead frame ends 178 and 179.

Figure 7:
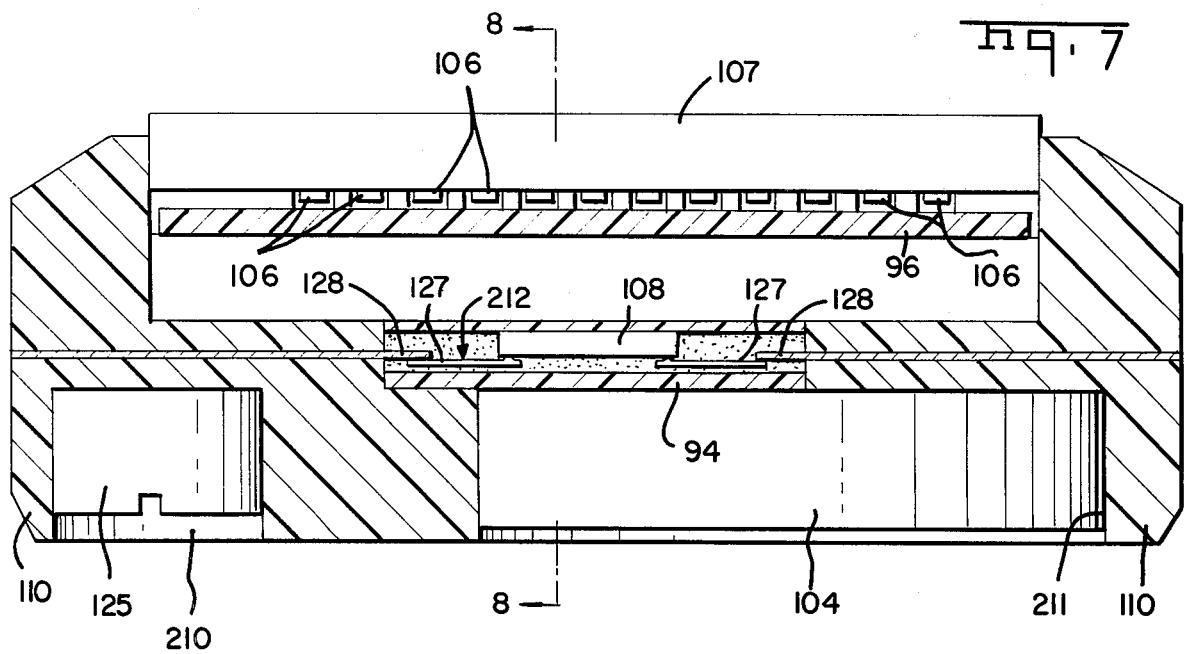
FIG. 7 is a sectional view of FIG. 1 taken along the plane 7—7 and showing the components in their position in the plastic encapsulated lead frame assembly.

Referring now to FIG. 7 there is shown a cross-sectional view of the operational portion 100 of FIG. 1 taken along the plane 7—7 and illustrating the relative spatial positioning of some of the elements of the watch assembly in plane 7—7. More particularly, battery 104 and trimmer capacitor 125 can be seen to fit into their respective cavities 211 and 210, respectively, in the bottom of plastic encapsulation 110. Two of the lead frame conductors 128 can be seen to pass through the encapsulating plastic 110 and extend into the opening 94 within the plastic 110, and attached by thermal compression bonding, for example, to the terminals 127 of the spider assembly 212. The LSI chip carrier 108 is in turn mounted upon the spider assembly 212. The LCD assembly 107 is shown mounted above the LSI chip 108, with the terminals 99 of the LCD assembly 107 also illustrated. Light diffusion plate 96 is positioned between LCD assembly 107 and LSI chip 108.

Figure 8:
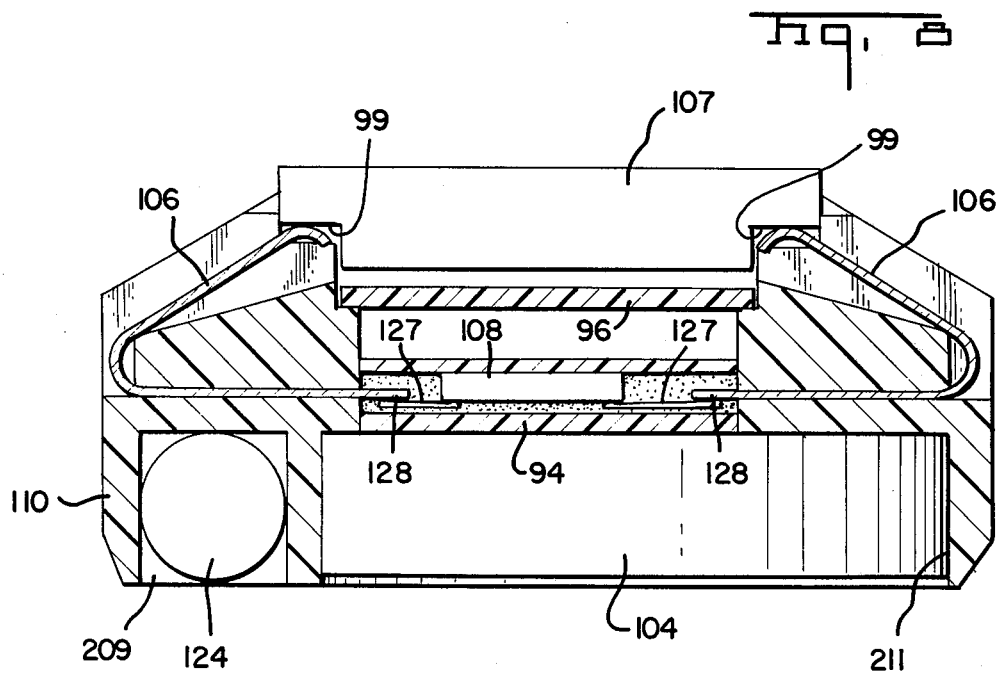
FIG. 8 is a sectional view of the structure of FIG. 1 taken along the plane 8—8 and showing the components in their position in the plastic encapsulated lead frame assembly.

FIG. 8 shows a sectional view of the structure 100 of FIG. 1 in the plane 8—8 of FIG. 1 and illustrates the relative positions of the components observable in the plane 8—8. More particularly, battery 104 and quartz crystal 124 are shown in their cavities 211 and 209, respectively. Lead frame conductors 106 of the lead frame are shown connected at first ends 128 to the terminals 127 of the spider assembly which support the chip carrier 108. The lead frame conductors 106 are connected at their other ends to terminals 99 of LCD assembly 107. Light diffusion plate 96 is positioned between the LCD assembly 107 and the chip 108.

In the particular device described in this specification, which is a watch and which is employed as a vehicle for disclosing the present invention, two apertures 215 and 216 are provided in the plastic encapsulation, as shown in FIGS. 3 and 6. These two apertures 215 and 216 are positioned to be coincident with supporting elements 280 and 281 (see FIG. 6) in the lead frame and must be severed in order to prevent electrical short circuits in the electrical interconnections between the various circuit components of the device. The aforementioned supporting elements 280 and 281 are included in the lead frame structure during stamping in order to hold said lead frame structure together until plastic encapsulation occurs. Separation of the supporting elements 280 and 281 is accomplished by means of the holes 215 and 216 of FIGS. 3 and 6 which receive a sharp tool. The sharp tool is inserted into the holes 215 and 216 and severs the portions 280 and 281 of the lead frame structure passing thereacross. Similarly the apertures 256 and 257 are formed in the plastic encapsulation, as shown in FIGS. 2 and 6, in order to permit entry of the leads 158 and 159 of the light source 109 therein to be crimped by the severed portions 156 and 157 (see FIG. 2) of the lead frame structure.

III. VARIOUS MEANS FOR ATTACHING COMPONENT TERMINALS TO LEAD FRAME AND USE OF APERTURES FOR SEVERING TEMPORARY SUPPORTING MEMBERS IN LEAD FRAME (FIGS. 9–22)

FIGS. 9, 10, 11 and 12 comprise a series of drawings illustrating the insertion of a typical circuit component (capacitor 122 of FIG. 3) into a cavity 180 in the plastic encapsulation 110, and the bending down of the two ends 142 and 143 of the lead frame extending into cavity 180 by the component 122 as it is inserted therein to make electrical connection with terminals 206 and 207 of capacitor 122 as well as to mechanically retain capacitor 122 within cavity 180.

More particularly FIG. 9 shows cavity 180 (also shown in FIG. 3) and further shows the two end terminals 142 and 143 of the lead frame structure which extend into cavity 180. The two terminals 142 and 143 are also shown in FIGS. 2, 3, 5 and 6.

FIG. 10 is a view of FIG. 9 taken along the plane 10—10 thereof and shows the capacitive component 122 poised above, and ready to be inserted into the cavity 180, in the direction of arrow 225.

FIG. 11 shows component 122 fully inserted into cavity 180 with the two lead frame terminal ends 142 and 143 in their bent-over positions and making contact with the terminals 206 and 207 of capacitor 122.

In FIG. 12 there is shown a sectional view of FIG. 11 taken along the plane 12—12 of FIG. 11, with the capacitor 122 fully inserted into cavity 180 and with the two terminals 206 and 207 formed on the surface of capacitor 122 making contact with the two bent-over lead frame ends 142 and 143. The capacitive element 122 is retained within cavity 180 by virtue of the frictional force and spring-like resiliency between the bent over terminals 142 and 143 and the terminals 206 and 207 of capacitor 122.

Figure 13:
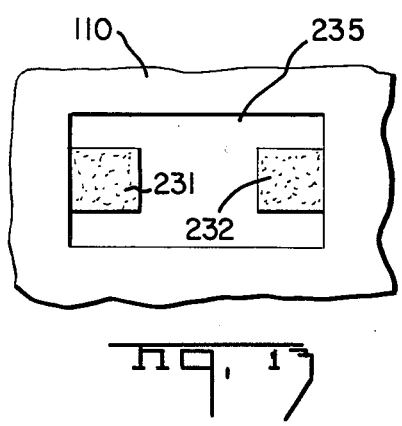
FIGS. 13 and 14 show another means for terminating a component in a cavity in the encapsulating plastic by bending over and making frictional engagement with the lead frame conductors which extend into said cavity simply by inserting said component into the cavity.
Figure 14:
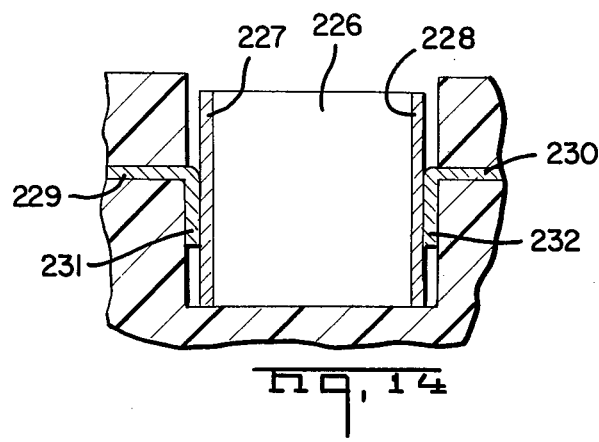

FIGS. 13 and 14 illustrate a different method of positioning the ends of the lead frame terminals 231 and 232 within the cavity 235. When a component 226 is inserted into the cavity 235 the ends 231 and 232 of the lead frame are bent over against the plated-on terminals 227 and 228 of component 226 which can be, for example, a capacitor, a resistor, or an inductor packaged in a rectangular configuration or in some other configuration suitable for insertion into the cavity 235 with resulting electrical connections and mechanical retention therein.

Figure 15:
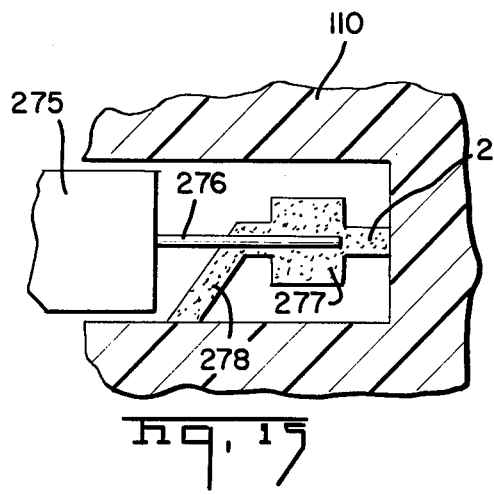
FIGS. 15 through 17 show a means for terminating the terminals of a component which are wire-like in nature by means of crimping portions of the lead frame conductors around said wire-like terminals.
Figure 16:
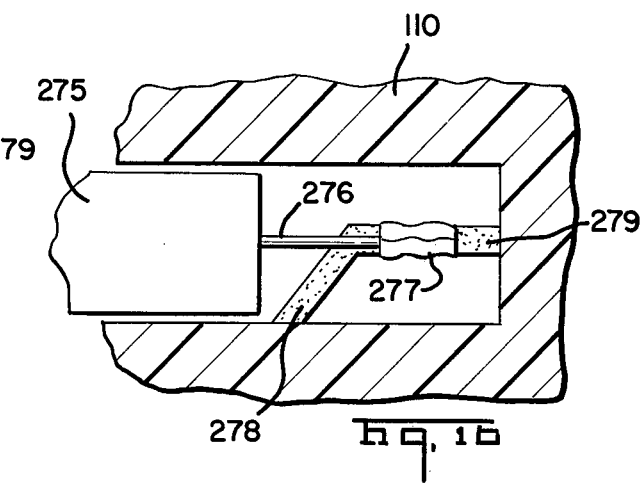
Figure 17:
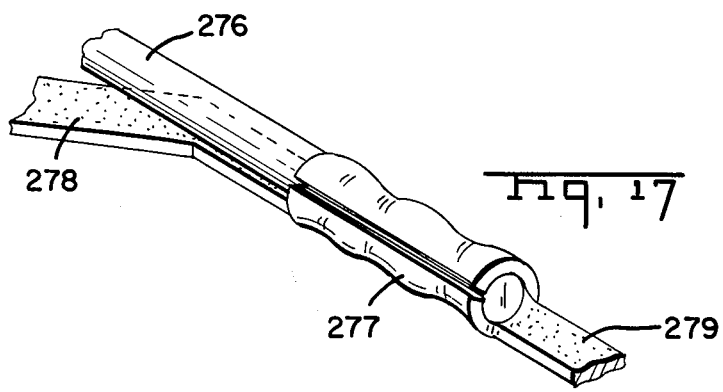

In FIGS. 15, 16 and 17 there is shown a means for connecting wire-like terminal leads of circuit components to terminating means formed from the lead frame and which are crimped around said wire-like terminals. More specifically, in FIG. 15 a circuit component 275 has a wire-like terminal 276 extending therefrom. A portion 277 of the lead frame has been stamped to coincide with the end of the wire-like terminal 276 and is shown in its uncrimped condition in FIG. 15.

In FIG. 16 the terminating means 277 is shown crimped around the terminal means 276 of cmponent 275. A perspective view of the crimped terminal is shown in FIG. 17. The portions 278 and 279 of the lead frame are provided to support the portion 277 to be crimped around terminal wire 276.

Figure 22:
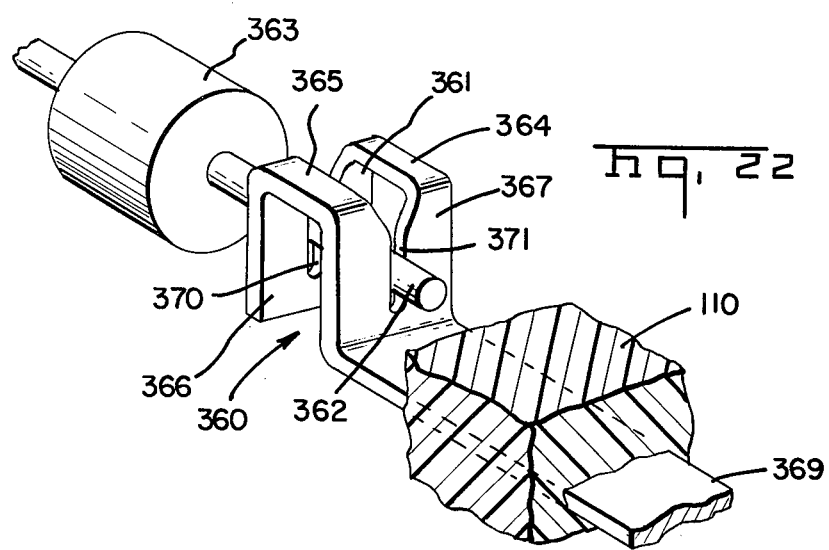
FIG. 22 shows another means of terminating components having wire-like terminals by inserting said wire-like terminals in a slotted terminating means formed from a portion of the lead frame.

FIG. 22 shows a terminating means 360 formed from the lead frame structure into an inverted U-shaped device with a slot 361 formed across the transverse element which is divided by said slot 361 into two legs 364 and 365. The slot 361 extends down into the legs 366 and 367 of the U-shaped terminating means with one leg 367 being attached to the main lead frame 369 encapsulating in plastic 110.

A wire-like terminal 362 of component 363 is inserted into the slots 370 and 371 in legs 366 and 367. The width of at least one of the slots 370 or 371 is less than the width of the wire-like terminal 362 and retains said wire-like terminal 362 in said slot.

As discussed generally above, during the stamping of the lead frame structure certain supporting elements are left therein solely for the purpose of holding the lead frame structure together until it can be encapsulated in plastic. After encapsulation in plastic it is necessary to sever these supporting elements in order to eliminate short circuits. The severing of such supporting elements is accomplished by leaving a hole in the encapsulating plastic which opens onto the supporting element to be removed. A punch can then be inserted into the hole to sever the supporting elements.

The foregoing structure and method of severing the supporting elements is shown in detail in FIGS. 18 through 21. FIG. 18 shows the supporting element 281 with a hole 216 formed coincident therewith in the plastic encapsulation 110 (see FIG. 6). FIG. 19 shows a sectional view of the structure of FIG. 18 taken through the plane 19—19 of FIG. 18. In FIG. 20 there is again shown a top view of the aperture 216 with a punch 261 being inserted therein. FIG. 21 is a cross-sectional view of the structure of FIG. 20 taken along the plane 21—21 of FIG. 20 and shows the punch 261 having entered the hole 216 and having severed the supporting element 281. While the configuration of the end of the punch 261 is shown as a sharp edged wedge 262 which severs the supporting element 281 at the cavity wall, other configurations of punches can be employed to sever the supporting element 281.

IV. SCHEMATIC CIRCUIT DIAGRAM OF WATCH STRUCTURE (FIG. 23)

The particular circuit shown in the three dimensional perspective diagram of FIG. 2 is also shown in conventional schematic form in FIG. 23. Further, the relation of such conventional schematic circuit to the LSI circuit chip logic is shown generally in FIG. 23.

More specifically, the various terminals or pins of the LSI circuit chip are shown connected to the leads of the spider assembly represented generally by terminals P-1 through P-36 and which supports the LSI chip, with the function of each terminal of the chip indicated in the chart set forth herein below. Also shown are the connections of the external circuit components of the schematic diagram to the various leads of the spider assembly. It is to be understood that the external circuit components are, in fact, connected to lead frame conductors which are in turn connected to the spider assembly terminals rather than being connected directly to the spider assembly terminals.

In the chart below the connection of each of the terminal pins P-1 through P-36 of the circuit chip is listed with its corresponding function generally defined. For example, in FIG. 23 the terminal P-1 of the circuit chip is connected to $V_{ref}$, which is the reference voltage of the watch. Similarly, terminal P-36 of the chip is connected to the case of the watch, as indicated in the chart below.

| PIN NO. | EXTERNAL CONNECTION | FUNCTION |
|---|---|---|
| Pin 1 | $V_{ref}$ | The most positive potential in the circuit |
| Pin 2 | S1 | Interrogated control input (normally activated by pushbutton switch) |
| Pin 3 | B1 | Segment B of digit 1 |
| Pin 4 | A1 | Segment A of digit 1 |
| Pin 5 | F1 | Segment F of digit 1 |
| Pin 6 | G1 | Segment G of digit 1 |
| Pin 7 | B2 | Segment B of digit 2 |
| Pin 8 | A2/D2 | Segments A and D of digit 2 (all displays of digit 2 require A and D to be displayed simultaneously) |
| Pin 9 | G2 | Segment G of digit 2 |
| Pin 10 | G2 | Segment G of digit 2 |
| Pin 11 | B3 | Segment B of digit 3 |
| Pin 12 | A3 | Segment A of digit 3 |
| Pin 13 | F3 | Segment F of digit 3 |
| Pin 14 | G3 | Segment G of digit 3 |
| Pin 15 | V Display Optional | |

-continued

| PIN NO. | EXTERNAL CONNECTION | FUNCTION |
|---|---|---|
| Pin 16 | Oscillator Output | |
| Pin 17 | Oscillator Input | |
| Pin 18 | Voltage Display | The voltage for the liquid crystal display |
| Pin 19 | $C_2$ | Completes circuit through external capacitor 123 to 1024 Az Reference |
| Pin 20 | 1024 Hz Reference | Oscillator frequency test point |
| Pin 21 | $C_1$ | Completes circuit through external capacitor 122 to Voltage Display (pin 18) |
| Pin 22 | Common | 32 Hz output to display common |
| Pin 23 | One | Segment for 10s of hours digit (B4 and C4) |
| Pin 24 | E3 | Segment E of digit 3 |
| Pin 25 | D3 | Segment D of digit 3 |
| Pin 26 | C3 | Segment C of digit 3 |
| Pin 27 | COLON | Colon output |
| Pin 28 | E2 | Segment E of digit 2 |
| Pin 29 | C2 | Segment C of digit 2 |
| Pin 30 | E1 | Segment E of digit 1 |
| Pin 31 | D1 | Segment D of digit 1 |
| Pin 32 | C1 | Segment C of digit 1 |
| Pin 33 | S2 | Set control input (normally activated by a pushbutton switch) |
| Pin 34 | TEST | Speeds up timing for automated testing |
| Pin 35 | V BATTERY | 1.5 volt battery (with respect to $V_{ref}$) |
| Pin 36 | CASE | The case input should be connected to the same potential as the input control switches. |

The circuit components, of the external circuit shown in schematic form in FIG. 23, and shown in perspective form in FIG. 2, include resistor 121, capacitors 120, 122 and 123, variable capacitor 125, quartz crystal 124, battery 104, lamp 109, switches $S_1$, $S_2$ and $S_3$ and the various interconnections therebetween.

The operation of the schematic circuit of FIG. 23 is as follows. Capacitor 120, variable capacitor 125, resistor 121 and crystal 124 form an oscillator circuit whose frequency can be adjusted by variable trimmer capacitor 125. The input and output leads of the oscillator circuit respectively go to pins P-17 and P-18 of LSI chip carrier 235.

The capacitor 122 is connected across the LSI terminals P-18 and P-21 to provide the size capacitor needed to supply the voltage for the LCD display. A second capacitor 123 is connected across the LSI terminals P-19 and P-20 to provide a means for checking the accuracy of the frequency within the LSI chip.

Battery 104 supplies the power for the entire device. A voltage deriving means 313 is provided within the LSI chip to derive suitable voltages from battery 104 to activate the various logic circuits contained within the LSI chip. More specifically, voltage deriving means 313 provides suitable voltages to frequency divider logic 310 and to logic circuit 311 via leads 320 and 321, respectively. The voltage deriving circuit 313 also provides a suitable voltage to LSI chip terminal P-21 via lead 322.

The positive side of battery 104 is supplied to several points in the external circuit including one side of each of switches $S_1$, $S_2$ and $S_3$, and also including pins P-1 and P-36 of the LSI chip which, respectively, are the voltage reference and case inputs of the LSI chip. The negative side of battery 104 is supplied to one side of the lamp 109 and also to pin P-35 of the LSI chip, which is the 1.5 volt battery terminal thereof.

Closure of switch $S_3$ energizes lamp 109 which functions to provide light to the light diffusion element 96 located underneath the LCD display 107 for night viewing.

The logic of the LSI chip can be designed to perform various functions in response to various combinations of closures and openings of the switches $S_1$ and $S_2$. One chip currently available on the market will produce the following functions in response to various combinations of closures and openings of switches $S_1$ and $S_2$.

Closure of the switch $S_1$ a single time will display hours, minutes and also the month and day. Two quick closures of switch $S_1$ causes a display of seconds, continuously. A third closure of $S_1$ will return the display to hours and minutes. One closure of $S_2$ alternately displays time in hours and minutes for two seconds and then calender, including the month and date, for a predetermined time interval, for example, two seconds. A closure of $S_1$ while in the alternating time-date mode, that is with $S_2$ having been closed immediately prior, will cause seconds to be displayed continuously. Another closure of $S_1$ returns the display to the alternating mode initiated originally by the closure of $S_2$.

Various other combinations of closures of switches $S_1$ and $S_2$ can result in different functions being exhibited on the LCD display by modifications of design of the logic of the LSI chip.

One quite generalized logic arrangement of the LSI chip is shown in FIG. 23. Such logic includes a frequency divider 310 which contains a series of frequency dividing circuits for stepping down the 32, 768 Hz signal produced by the external oscillator circuit (including crystal 124) to various levels which are then supplied to the logic circuit 311. The logic circuit 311 includes various gating, counting and driving circuits which respond to selected frequencies from the output of frequency divider circuit 310, and also to various combinations of closures and openings of switches $S_1$ and $S_2$ to energize selected segments of LCD display 107. Such selected segments of LCD display 107 will display such various functions as hours, minutes, seconds, months or date.

Various required voltage levels are derived by voltage deriving circuit 313 and supplied to portions of the logic requiring such voltages, including frequency divider circuit 310 and logic circuit 311. As can be seen from FIG. 23, the inputs to the voltage deriving circuit 311 include the terminals received on LSI chip pin terminals P-1, P-36 and P-35, which are labeled respectively, V reference, case and V battery.

One of the outputs of voltage deriving circuit 313 is supplied to one plate of external capacitor 122 through LSI terminal P-21, with the other plate of capacitor 122 returning to the logic circuit 311 via the voltage display terminal P-18 of the LSI chip.

One of the outputs of the frequency divider circuit 310 is supplied to one plate of external capacitor 123 via terminal P-20 of the LSI chip and returned to frequency divider circuit 310 from the other plate of capacitor 122 via LSI chip terminal P-19. The foregoing circuit provides a 1024 Hz output across the external capacitor 123 to enable a frequency test of the circuit.

The various output terminals identified generally by brackets 315, 316 and 317 are connected via the spider assembly and the lead frame to terminals on the LCD display. Excitations of various combinations of such terminals will produce activation of preselected combinations of the LCD segments, thereby indicating the particular function selected by the switches such as the hours, seconds, date, or month.

A detailed description of the operation of the electronics of the LSI chip will not be given in this specification inasmuch as such electronics thereof do not per se constitute the invention. As discussed above, the invention comprises the use of one or more lead frame structures encapsulated in plastic having cavities therein and into which cavities the ends of selected ones of the lead frame conductors extend, and the insertion of components into said cavities to make contact with the ends of said lead frame conductors to produce a complete circuit which will perform a useful function. Such devices can include watches, calculators, appliance control circuits, instrumentations of various types, meters, communication devices, and many other electronic structures.

V. USE OF APERTURES IN PLASTIC ENCAPSULATION TO ALTER LEAD FRAME CIRCUIT AFTER ENCAPSULATION IN PLASTIC (FIG. 24)

Not only can a particular configuration of lead frame structure and plastic encapsulation with components inserted therein be arranged to form different devices, but a given combination of lead frame configuration, and plastic encapsulation with cavities and apertures appropriately positioned, and selected components can be employed with the capability of forming more than one device. Such formation of different circuits or devices is implemented by providing holes in the plastic encapsulation at various selected points in order to sever the lead frame conductors to either add circuitry into an overall circuit or to modify or remove components from a given circuit, thereby producing different circuits which perform different and various combinations of functions.

Figure 24:
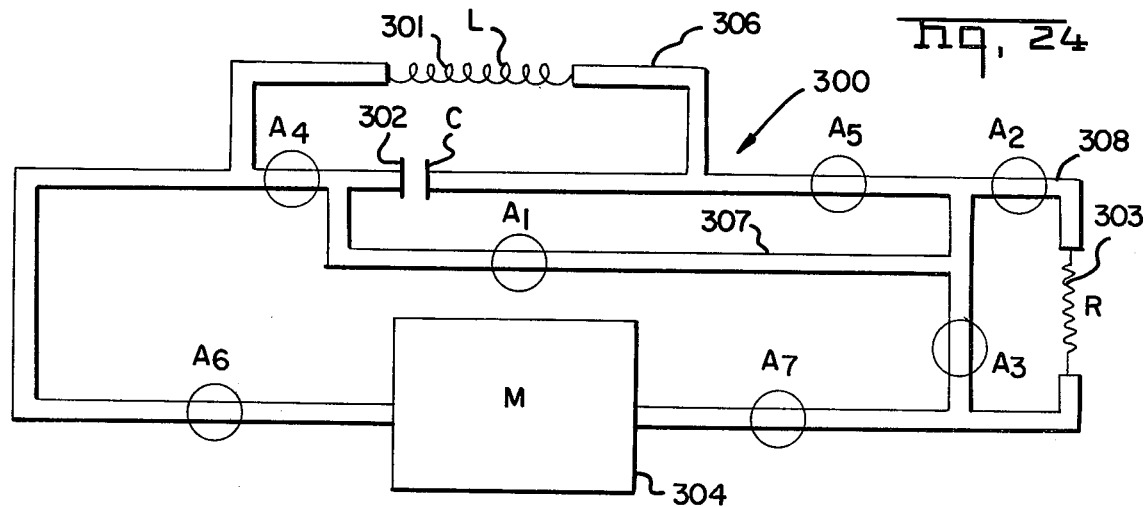
FIG. 24 shows a lead frame structure with various components connected therein and which can be formed into a number of different circuits simply by severing different combinations of lead frame conductors.
Figure 25:
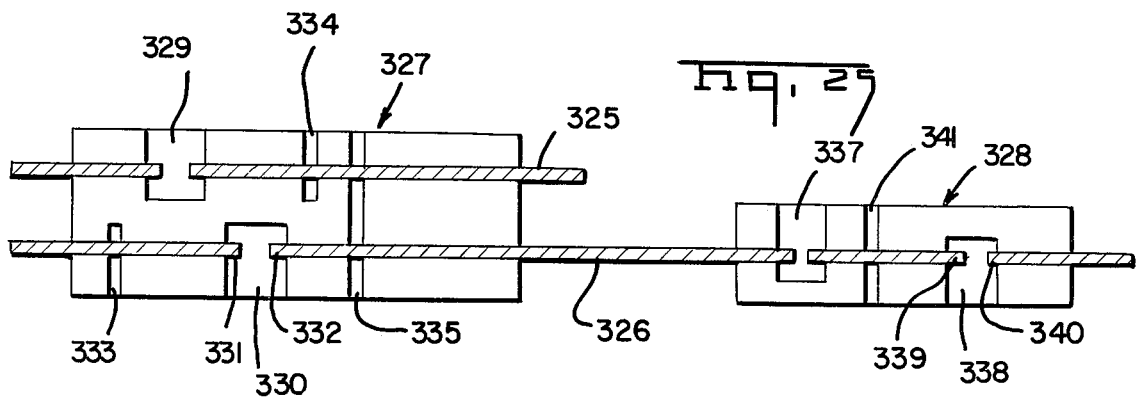
FIG. 25 is an illustration of the use of more than one lead frame stacked one upon the other and the use of more than one plastic encapsulation each of which can encompass one or more of the lead frame structures.

Reference is made to FIG. 24 in which a lead frame configuration 300 has a number of legs or conductors therein which connect together an inductor 301, a capacitor 302, a resistor 303 and a circuit 304 which could be, for example, an LSI chip or any other desired circuit. Also shown in FIG. 24 are a number of circles A1 through A7 which represent apertures in a plastic encapsulation formed around the entire lead frame assembly 300, with appropriate cavities therein for insertion of the various circuit components 301, 302, 303 and 304.

By severing certain segments of the lead frame coinciding with the apertures A1 to A7, various circuits can be formed. For example, by severing the lead frame coinciding with apertures A1 and A3, a circuit is formed consisting of the parallel circuit of inductor 301 and capacitor 302 in series arrangement with the resistor 303 and the circuit 304. Alternatively, by severing the lead frame conductors coinciding with apertures A1 and A2, a circuit is formed consisting of the parallel arrangement of inductor 301, capacitor 302 in series with the circuit 304.

A series circuit including the series arrangement of inductor 301 and capacitor 302 can be formed by severing the lead frame conductors coinciding with apertures A4, A5 and A3. Such a series circuit includes inductor 301 in series with one plate of capacitor 302 through lead frame conductor 306 and then extending from the other plate of capacitor 302 to the circuit 304 through lead frame conductor 307, lead frame conductor 308 and resistor 303.

Various other combinations of severance of the segments of the lead frame 300 will result in different circuit arrangements in accordance with the chart below:

| CIRCUIT | PUNCH OUT HOLES |
| --- | --- |
| 1 - Paralleled LC in series with R and M | A1, A3 |
| 2 - Paralleled LC in series with M | A1, A2 |
| 3 - Series LC in series with R and M | A4, A5, A3 |
| 4 - Series LC in series with M | A4, A5, A2 |
| 5 - L in series with M | A4, A1, A2 |
| 6 - M by itself | A6, A7 |

VI. OTHER FORMS OF APPLICATIONS OF THE INVENTION (FIG. 25)

Referring now to FIG. 25 there is shown a form of the invention employing two lead frames 325 and 326 and two plastic encapsulations 327 and 328. The plastic encapsulation 327 encompasses portions of both lead frames 325 and 326 whereas the plastic encapsulation 328 encompasses only a portion of lead frame 326.

The plastic encapsulation 327 contains cavities 329 and 330 formed therein with portions of the lead frame structure extending into said cavities 329 and 330 to form terminals for components (not shown) which are to be inserted in said cavities 329 and 330. As an example, the terminating means 331 and 332 extends into cavity 330.

Also formed in the plastic encapsulation 327 are apertures 333 and 334 which can be employed to sever portions of the lead frame 325. Another aperture 335 extends completely through the plastic encapsulation 327 and provides a means for electrically connecting the lead frame 325 to the lead frame 326 by inserting a conductive pin, for example, through aperture 335. The plastic encapsulation 328 is shown as having cavities 337 and 338 formed therein each with terminating means extending into said cavities 337 and 338 from the lead frame 326. Specifically, cavity 338 has terminating means 339 and 340 extending therein. An aperture 341 is provided in encapsulating means 328 to provide access means for breaking the lead frame structure 326 at some desired point.

The lead frame as shown in FIG. 5 contains a large number of individual conductors which are later associated with, and make contact with, the terminal pads in the display device 107, the leads 127 from the circuit chip and with all the discrete components as shown at 121, 122, and 123. Selected conductors of the lead frame ultimately serve as switch contacts shown at $S_2$ and $S_3$ in FIG. 4 and are located in suitable switch recesses in the molded body 110. Also, certain sections of the lead frame serve only as structural connecting members and are electrically interrupted, as explained above, during the manufacturing process thereby to isolate other conductors in the lead frame after encapsulation. The conductors of the lead frame, as shown in FIG. 5, can thus be identified with specific reference to their final function. For example, the conductors 106 can be identified as terminal pad conductors since they extend to the terminal pads of the chip in the finished device and the inner ends of these conductors, which surround the central opening in the lead frame, can be identified as chip conductors since they are connected to the leads 127 which are in turn connected to the chip. The irregularly located conductors which are connected to the discrete components can be identified as component conductors and the conductors which are formed towards the body 110 of insulating material to form the switch contacts can be identified as switch contact conductors. The various recesses which receive the chip, and the components are similarly identified with reference to their purpose in the manufacturing process.

It is to be understood that the forms of the invention shown and described herein are but preferred embodiments thereof and that the principles of the invention are applicable to many different devices, as discussed above, with many different configurations of lead frame structures, plastic encapsulations, position of cavities and apertures in said plastic encapsulation, and the combination of many different types of circuit components.

I claim:

1. A method of manufacturing an electronic device containing a panel-like member, an integrated circuit chip, and a plurality of discrete components, said panel-like member having spaced-apart terminal pads located on opposite side portions of one surface thereof, said method comprising the steps of:

stamping a flat lead frame having individual chip conductors for establishing contact with said integrated circuit chip, having terminal pad conductors for establishing contact with said terminal pads on said panel-like member, and having component conductors for establishing contact with said discrete components, at least some of said conductors being connected to other conductors by structural connecting sections of said lead frame, molding an insulating material on said lead frame to form an insulating body having component openings therein for reception of said discrete components, having a chip-receiving recess therein for reception of said integrated circuit chip, and having tool-receiving access opening therein, said terminal pad conductors extending laterally from said body, said chip conductors extending into said chip-receiving recess, said component conductors extending into said component-receiving openings and said connecting sections being in said access openings, reversely bending said terminal pad conductors towards and over said body whereby end portions of said terminal pad conductors form contact springs which are spaced from, and flexible towards said body, inserting tooling means into said access openings and electrically interrupting said structural connecting sections, positioning said integrated circuit chip in said chip-receiving recess and connecting the active areas of said chip to said lead frame chip conductors, inserting said discrete components into said discrete component openings thereby electrically to connect said components to said component conductors, positioning said panel-like member on said body with said terminal pads against said contact springs, and clamping said panel-like member against said body with said terminal pads on said panel-like member against said contact springs whereby said chip and said discrete components are connected to each other and to said terminal pads in accordance with a predetermined circuit arrangement.

2. The method set forth in claim 1 including the step of molding on said insulating body a plurality of spaced-apart barrier walls which define side-by-side stalls, said stalls being in alignment with said terminal pad conductors and said contact springs being in said stalls after reverse bending of said terminal pad conductors.

3. The method set forth in claim 1, said chip-receiving recess being centrally located on said insulating body.

4. A method as set forth in claim 3, said lead frame having at least one pair of associated switch conductors extending radially from said body after molding of said insulating material on said lead frame, and including the step of bending said switch conductors towards said body and locating said switch conductors in overlapping normally spaced relationship to each other.

5. A method as set forth in claim 4, said electronic device comprising a digital watch, said panel-like member comprising a display, said step of clamping said panel-like member against said terminal pad conductors being carried out by encasing said display and said body in a watch casing.

6. A method of manufacturing an electronic device such as a digital watch, having a display device, an integrated circuit chip, a plurality of discrete components, and at least one control switch, said display device having spaced-apart terminal pads on one surface thereof which are connected to the circuitry of said watch, said method comprising the steps of:

stamping a flat lead frame having individual chip conductors for establishing contact with said circuit chip, having terminal pad conductors for establishing contact with said terminal pads on said display device, having component conductors for establishing contact with said discrete components, and having switch contact conductors, at least some of said conductors being connected to said lead frame by structural connecting sections of said lead frame, molding insulating material on said lead frame to form an insulating body having component-receiving openings therein for reception of said discrete components, having a central chip-receiving recess therein on one surface thereof for reception of said circuit chip, having tool-receiving access openings therein, having a plurality of spaced-apart barrier walls extending therefrom adjacent to said chip-receiving recess which define side-by-side stalls, and having a control switch recess on one laterally facing side surface, said terminal pad conductors extending radially from said body in alignment with said stalls and said contact switch conductors extending from said body and into said switch recess, said chip conductors extending into said chip-receiving recess, said component conductors extending into said component-receiving openings, and said connecting sections extending through said access openings, reversely bending said terminal pad conductors towards and over said body so that end portions of said terminal pad conductors form contact springs which are disposed in said stalls and which are spaced from, and flexible towards, said body, bending said switch contact conductors into said switch recess so that said switch contact conductors are spaced-apart and flexibly movable towards and against each other, inserting tooling means into said access openings and electrically interrupting said structural connecting sections, positioning said integrated circuit chip in said chip-receiving recess and connecting the active areas of said chip to said lead frame chip conductors, inserting said discrete components into said discrete component openings thereby electrically to connect said components to said component conductors, positioning said display device on said body with said terminal pads against said contact springs, and, assembling a casing, having switch actuator means therein, to said body and into surrounding relationship with said body and said display device thereby electrically to connect said terminal pads to said contact springs and to position said switch actuator means proximate to said switch contacts.

* * * * *